US009564288B2

(12) United States Patent
Ominami et al.

(10) Patent No.: US 9,564,288 B2
(45) Date of Patent: Feb. 7, 2017

(54) SAMPLE STORAGE CONTAINER, CHARGED PARTICLE BEAM APPARATUS, AND IMAGE ACQUIRING METHOD

(71) Applicant: Hitachi High-Technologies Corporation, Minato-ku, Tokyo (JP)

(72) Inventors: Yusuke Ominami, Tokyo (JP); Shinsuke Kawanishi, Tokyo (JP); Hiroyuki Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/438,691

(22) PCT Filed: Oct. 29, 2013

(86) PCT No.: PCT/JP2013/079296
§ 371 (c)(1),
(2) Date: Apr. 27, 2015

(87) PCT Pub. No.: WO2014/069470
PCT Pub. Date: May 8, 2014

(65) Prior Publication Data
US 2015/0255244 A1 Sep. 10, 2015

(30) Foreign Application Priority Data
Oct. 29, 2012 (JP) .................................. 2012-237411

(51) Int. Cl.
*H01J 37/16* (2006.01)
*H01J 37/20* (2006.01)
*H01J 37/28* (2006.01)

(52) U.S. Cl.
CPC ................ *H01J 37/16* (2013.01); *H01J 37/20* (2013.01); *H01J 37/28* (2013.01);
(Continued)

(58) Field of Classification Search
USPC ........................................................ 250/307
See application file for complete search history.

(56) References Cited

U.S. PATENT DOCUMENTS 6,838,685 B1 * 1/2005 Kodama .................. G01N 1/32
250/442.11
7,351,969 B2 * 4/2008 Watanabe ............. H01J 37/224
250/305
(Continued)

FOREIGN PATENT DOCUMENTS

JP 2004-515049 A 5/2004
JP 2006-147430 A 6/2006
(Continued)

OTHER PUBLICATIONS

International Search Report (PCT/ISA/210) dated Jan. 7, 2014 with English translation (eight pages).
(Continued)

Primary Examiner — Phillip A Johnston
(74) Attorney, Agent, or Firm — Crowell & Moring LLP

(57) ABSTRACT

A sample storage container of the present invention includes: a storage container (100) that stores a sample (6) under an atmosphere different from an atmosphere of an outside; a diaphragm (10) through which a charged particle beam passes through or transmits; a sample stage (103) that is arranged inside the storage container (100) and that is capable of moving a relative position of the sample (6) to the diaphragm (10) in a horizontal direction and in a vertical direction under an atmospheric state where the atmospheric states inside the storage container and outside the storage container are different each other; and an operating section (104) that moves the sample stage (103) from an outside of the storage container (100), wherein the sample storage
(Continued)

container is set in a state where the sample (6) is stored in a vacuum chamber of a charged particle beam apparatus.

14 Claims, 15 Drawing Sheets

(52) U.S. Cl.
CPC ... *H01J 2237/164* (2013.01); *H01J 2237/182* (2013.01); *H01J 2237/188* (2013.01); *H01J 2237/2003* (2013.01); *H01J 2237/2006* (2013.01); *H01J 2237/20221* (2013.01); *H01J 2237/20235* (2013.01); *H01J 2237/28* (2013.01)

(56) References Cited

U.S. PATENT DOCUMENTS

| | | | |
|---|---|---|---|
| 8,710,439 B2* | 4/2014 | Ominami | H01J 37/18 250/306 |
| 8,729,497 B2* | 5/2014 | Nagakubo | H01J 37/185 250/311 |
| 2004/0046120 A1 | 3/2004 | Moses et al. | |
| 2009/0166536 A1 | 7/2009 | Suga et al. | |
| 2010/0243888 A1 | 9/2010 | Nishiyama et al. | |
| 2012/0112062 A1* | 5/2012 | Novak | H01J 37/18 250/307 |
| 2013/0313430 A1 | 11/2013 | Ominami et al. | |

FOREIGN PATENT DOCUMENTS

| | | |
|---|---|---|
| JP | 2009-158222 A | 7/2009 |
| JP | 2009-259760 A | 11/2009 |
| JP | 2012-104478 A | 5/2012 |
| JP | 2012-160267 A | 8/2012 |
| WO | WO 02/45125 A1 | 6/2002 |
| WO | WO 2010/001399 A1 | 1/2010 |

OTHER PUBLICATIONS

Japanese-language Written Opinion (PCT/ISA/237) dated Jan. 7, 2014 (six pages).
German Office Action issued in counterpart German Application No. 11 2013 004 703.9 dated Aug. 18, 2016 with English translation (11 pages).

* cited by examiner

SAMPLE STORAGE CONTAINER, CHARGED PARTICLE BEAM APPARATUS, AND IMAGE ACQUIRING METHOD

TECHNICAL FIELD

The present invention relates to a microscopic technique by which an observed sample can be observed under atmospheric pressure or a given gas atmosphere.

BACKGROUND ART

In order to observe a very small area of an object, a scanning electron microscope (SEM), a transmission electron microscope (TEM), etc. are used. Generally, in these pieces of apparatus, the air is evacuated from a casing in which a sample is set, to make a sample atmosphere as a vacuum state for capturing an image of the sample. However, a biochemical sample, soft material and the like may be damaged or changed in state in the vacuum. On the other hand, a demand is growing for observing such samples with an electron microscope, which leads to development of sample storage casings with which an observed sample can be observed under atmospheric pressure or in a desired type of gas, SEM apparatus and the like.

These pieces of apparatus, in principle, have a diaphragm or minute holes through which electron beams can transmit, between an electronic optical system and a sample to separate the vacuum state from an atmospheric state. These pieces of apparatus have a diaphragm between the sample and the electronic optical system in common.

For example, Patent Document 1 discloses a sample storage container having a diaphragm through which electron beams transmit on an upper surface side. Reflected electrons or secondary electrons from the sample, which have contacted the diaphragm, are detected for an observation with a SEM. The sample is maintained in a space formed by an annular member arranged around the diaphragm and the diaphragm, and the space is filled with liquid such as water.

In addition, Patent Document 2 discloses a SEM in which an electron source side of an electron optical column is arranged to face downward, an object lens side is arranged to face upward, and a diaphragm is arranged via an O-ring on an emitting hole of electron beams at an end of the electron optical column such that the electron beams can transmit. In the invention disclosed in the Patent Document 2, an observed sample is directly set on the diaphragm, and primary electron beams are irradiated from a lower surface of the sample to detect reflected electrons or secondary electrons for an observation with the SEM. The sample is maintained in a space formed by an annular member arranged around the diaphragm and the diaphragm, and the space is filled with liquid such as water.

PRIOR ART DOCUMENTS

Patent Documents

Patent Document 1: Japanese Patent Application Publication No. 2004-515049 (International publication No. 2002/045125)

Patent Document 2: Japanese Patent Application Publication No. 2009-158222 (US Patent Application Publication No. 2009/0166536)

SUMMARY OF THE INVENTION

Problems to be Solved by the Invention

The conventional sample storage containers used for sample observation under the atmospheric state are mainly made for observing a substance in liquid, and basically, the sample is supposed to be observed in a state where the sample completely contacts the diaphragm. In addition, even if the sample is arranged in a state of not being fully in contact with the diaphragm, the sample cannot be independently moved from the diaphragm inside a local environment formed in a vacuum chamber of a charged particle beam apparatus to adjust a relative position between the sample and the diaphragm. Therefore, the sample out of sight of the diaphragm cannot be observed. In addition, a solid sample is difficult to be observed for the same reason.

Here, the present invention is provided in view of these problems and it is an object of the present invention to provide a sample storage container, a charged particle beam apparatus and an image acquiring method for allowing most parts of a sample to be observed regardless of a sample form.

Solution to Problems

In order to solve the above problems, an aspect of the present invention provides a sample storage container for a charged particle beam apparatus including a partition wall for storing a sample, a diaphragm that is arranged on the partition wall and through which charged particle beams can pass through or transmit, and a position adjustment mechanism. The sample can be irradiated by the charged particle beam via the diaphragm in a state where a sample atmosphere state inside the partition wall is different from that outside the partition wall. The position adjustment mechanism adjusts a relative position between the sample and the diaphragm by moving the sample with respect to the diaphragm independently.

Advantageous Effects of the Invention

According to the present invention, a sample storage container, a charged particle beam apparatus and an image acquiring method can be provided, by which, for a sample larger than an area of a diaphragm, a sample area larger than the area of the diaphragm regardless of a sample form can be observed.

Subjects, structures and advantageous effects other than described above will be apparent from the description of embodiments below.

EMBODIMENTS OF THE INVENTION

Hereinafter, each embodiment will be described by referring to accompanying drawings.

A charged particle microscope will be described below as one example of a charged particle beam apparatus. However, this is just one example of the present invention and the present invention is not limited to the embodiments described below. The present invention can also be applied to a scanning electron microscope, a scanning ion microscope, a scanning transmission electron microscope, a complex apparatus of any of these microscopes and a sample processing apparatus, or an analysis/detection apparatus applying any of these pieces of apparatus.

In addition, an "atmospheric pressure" means an environment having the atmospheric pressure or pressure at the same lecel as the atmospheric pressure, as being the atmosphere or a given gas environment in a negative pressure state or in a pressurized state slightly.

Specifically, the pressure ranges approximately from $10^5$ Pa (atmospheric pressure) to $10^3$ Pa.

Embodiment 1

In a present embodiment, a structure of one piece of apparatus for adjusting a position of a sample inside a sample storage container from an outside of a charged particle beam apparatus and a method thereof will be described.

<Description of Sample Storage Container>

Figure 1:
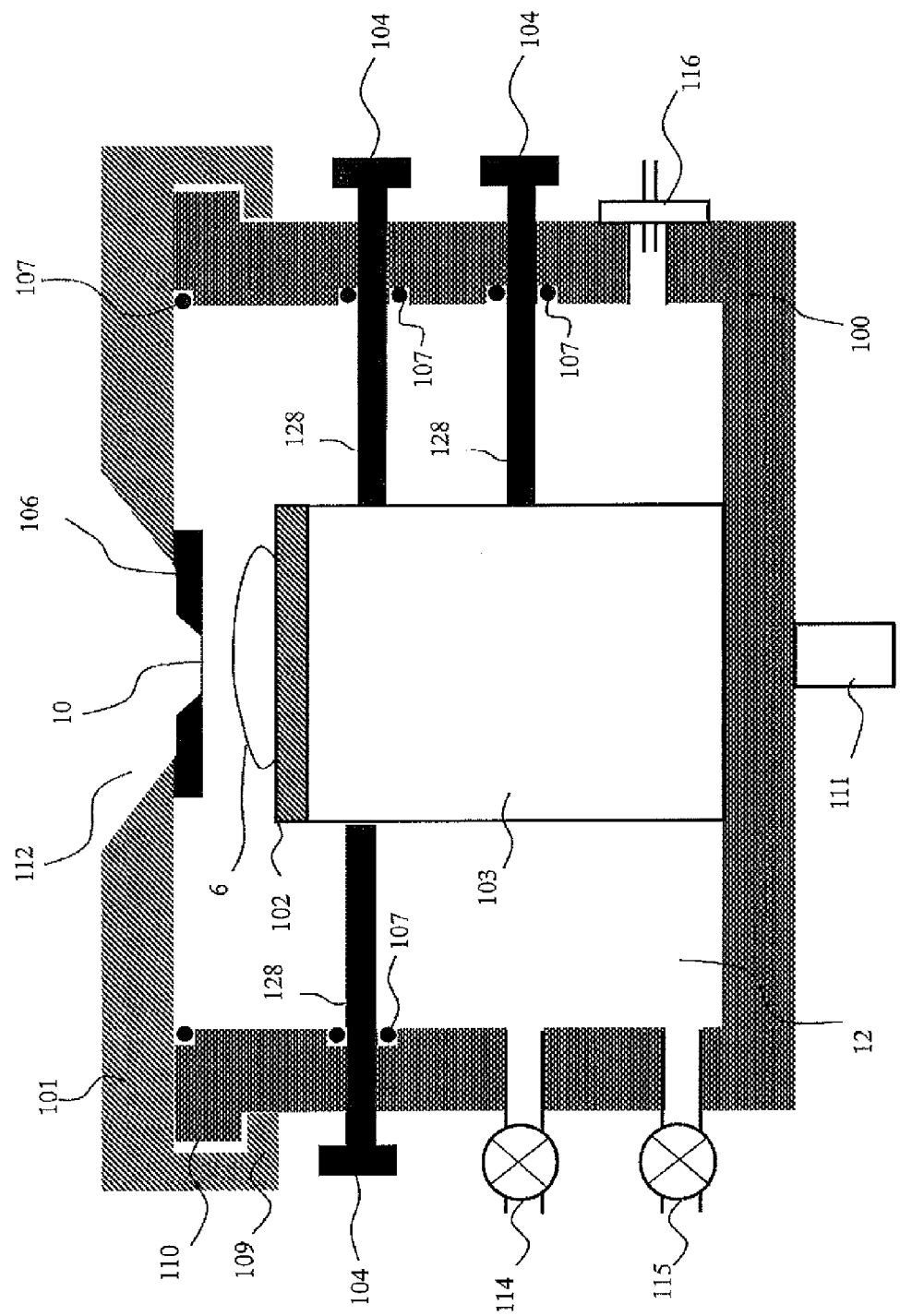
FIG. 1 is a view showing a structure of a sample storage container in an embodiment 1.

FIG. 1 shows an entire structure of the sample storage container of the present embodiment. The sample storage container shown in FIG. 1 mainly includes a storage container 100, a lid 101, a sample table 102, a sample stage 103 that has a driving mechanism for changing a position of the sample table 102, a plurality of operating sections 104 that are used for moving the sample stage 103 from an outside of the sample storage container, mechanical elements 128 between the operating sections 104 and the sample stage 103, a diaphragm 10 through which charged particle beams pass or transmit, and a diaphragm holding member 106 that holds the diaphragm 10. A sample 6 is set on the sample table and is stored, with the sample table, inside the storage container 100 of a closed space. A vacuum sealing member 107 such as an O-ring and a packing is arranged between the lid 101 and the storage container 100 to keep types of gas and states of an atmospheric pressure separated between inside the sample storage container and outside the sample storage container. A lower surface of the sample stage 103 is fixed to a bottom surface of the storage container 100 by screws or the like (not shown).

The lid 101 can be detached from the storage container 100. As will be described later, an inside of the storage container 100 is a space under the atmospheric pressure or a desired gas pressure in a state that the storage container 100 is arranged in the charged particle beam apparatus, and an outside of the storage container 100 is in a vacuum state. Therefore, a force is applied on the lid 101 in a direction being pushed from the inside of the storage container 100. The lid 101 may have a structure by a combination of a projection 109 joined to the lid 101 and a projection 110 joined to the storage container 100 to prevent the lid 101 from coming off even if the force is applied on the lid 101 in the direction being pushed from the inside of the storage container 100. In this case, the lid 101 can be detached from the storage container 100 by sliding in a direction perpendicular to the plane of paper in FIG. 1. In addition, as another example, the lid 101 may be fixed to the storage container 100 with a screw or the like (not shown). Further, as another example, the storage container 100 and the lid 101 may be formed with a male screw and a female screw respectively and may be rotated with each other to join. A fixing device for the lid 101 is not limited to the above examples, and the lid 101 may be fixed on the storage container 100 by a force at a level of the lid 101 and the storage container 100 withstanding a pressure difference between inside and outside the sample storage container.

In the present embodiment, the sample stage 103 is configured to have a driving mechanism that can move a position of the sample 6 in a direction closer to or away from the diaphragm (Z-axis) and a driving mechanism that can move the position of the sample 6 in a lateral direction or in a direction perpendicular to the plane of paper in FIG. 1 (XY-axes). Consequently, the plurality of operating sections 104 (interface) are also arranged. A rotational driving mechanism that rotates the sample 6 on the sample table may be employed. These driving mechanisms are arranged inside the sample storage container, and the sample stage 103 is operated via the mechanical elements 128 by the operating sections 104 arranged outside the sample storage container. The mechanical elements 128 are, for example, rotatable shafts or bars. The operating sections 104 can be operated by rotating, pushing or pulling. The vacuum sealing members 107 such as O-rings or packings are provided between the storage container 100 and the mechanical elements 128 so as not to change types of gas and states of atmospheric pressure outside and inside the sample storage container. With this structure, the pressure difference between inside and outside the sample storage container is maintained, and the sample 6 can be driven independently from the diaphragm 10, while a state of atmosphere (pressure, types of gas) inside the sample storage container being maintained. In other words, according to the position adjustment mechanisms described above, the position of the sample 6 relative to the diaphragm 10 can be adjusted from outside the sample storage container. Note that, as will be described later, the sample storage container is arranged on a flat surface of a stage, a table or the like in the charged particle beam apparatus and the operating sections 104 are operated while the sample is observed with an optical microscope. Therefore, many of the operating sections 104 are desirably arranged on a side surface of the sample storage container as shown in FIG. 1. The sample 6 does not contact the diaphragm 10 and the sample can be moved independently from the diaphragm 10 in a direction parallel to the diaphragm 10, which allows a very wide range of the sample to be observed (at least wider than an area of the diaphragm). In addition, the sample does not contact the diaphragm, which eliminates replacing diaphragm every time the sample is replaced.

On a lower side (bottom surface side) of the sample storage container, an alignment section 111 is arranged which arranges the sample storage container on a sample stage, to be described later, in the charged particle beam apparatus. The alignment section 111 is shown in a convex form, but may have a concave form or other forms. The alignment section 111 engages with a corresponding section of the sample stage to fix the sample storage container on the sample stage.

The sample 6 is arranged in the sample storage container. The sample 6 is set on the sample table 102 that is arranged on the sample stage 103. If the sample 6 is taken out from the sample storage container, only the sample 6 may be taken out or the sample table 102 itself may be taken out.

The lid 101 includes a diaphragm holding member 106 having the diaphragm 10. An adhesive, a double sided tape, vacuum grease, an O-ring, a packing or the like is arranged between the lid 101 and the diaphragm holding member 106 to keep airtight therebetween. An opening 112 is formed in the lid 101, since the charged particle beams are emitted from above the lid 101 in FIG. 1 on the diaphragm 10 and the sample 6. As will be described later, a detector is arranged on an upper part of the lid 101 for detecting secondary charged particles that are emitted from the sample. Therefore, in order to detect the secondary charged particles efficiently, the opening 112 desirably has a shape in which an opening area on an upper surface of the lid 101 is wider than that on a lower surface. In FIG. 1, the opening 112 configured to have a tapered shape is shown.

Figure 2:
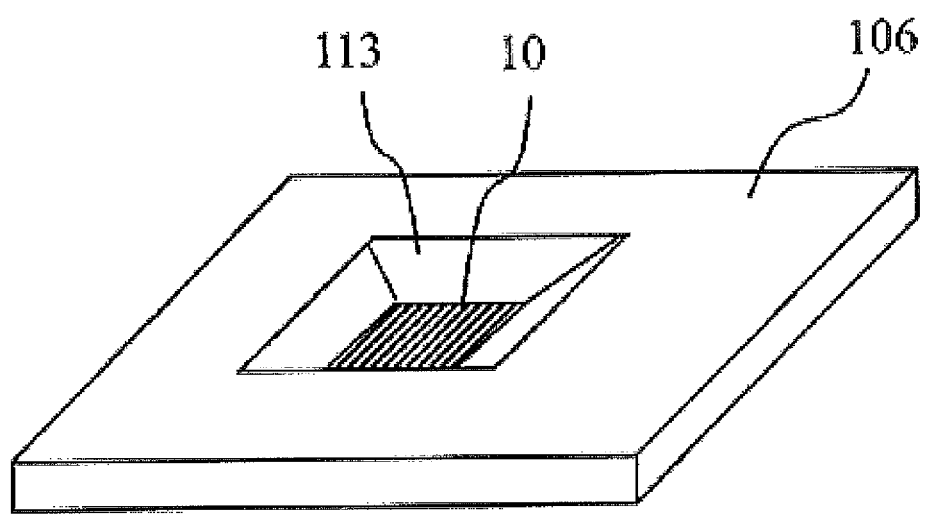
FIG. 2 is a view showing a diaphragm in detail.

FIG. 2 shows the diaphragm 10 in detail. The diaphragm 10 is formed or deposited on the diaphragm holding member 106. The diaphragm 10 is made of carbon material, organic material, silicon nitride, silicon carbide, silicon oxide or the like. The diaphragm holding member 106 is a member, for example, made of silicon and is formed with a taper hole 113 as shown in FIG. 2 by a process such as a wet etching. In FIG. 2, the diaphragm 10 is arranged on a lower surface of the diaphragm holding member 106. The diaphragm 10 may be formed with a plurality of windows. A thickness of the diaphragm through which primary charged particle beams can transmit or pass through is at a level of several nm to several μm. The diaphragm is required not to be broken under a differential pressure for separating the atmospheric pressure from the vacuum. Therefore, the diaphragm 10 has an area ranging from several ten $\mu m^2$ to several $mm^2$ at most. The diaphragm 10 is not necessarily in a square shape but may be in any shape such as rectangular. A side shown in FIG. 2, that is, the side formed with the taper part 113 is arranged on a vacuum side (upper side in FIG. 2). This allows a detector 3 to efficiently detect the secondary charged particles emitted from the sample.

The sample storage container includes a gas inlet/outlet port 114 and a gas outlet port 115. These ports include valve mechanisms that can separate/communicate a state of an atmosphere in an outer space of the sample storage container from/with a state of a gas atmosphere in an inner space 12. A desired gas is introduced through the gas inlet/outlet port 114 in a state that the storage container 100 is closed with the lid 101. However, if the pressure inside the sample storage container rises too high, the diaphragm 10 may be in danger of breakage. To avoid such a situation, the gas is introduced through the gas inlet/outlet port 114 with the gas outlet port 115 remaining open, allowing the inner space 12 to be filled with the gas atmosphere having desired pressure without applying pressure on the diaphragm 10. The gas outlet port 115 may be a safety valve or the like that opens automatically when the pressure in the inner space 12 goes higher than that in the outer space of the sample storage container. In addition, a vacuum pump may be attached to the gas outlet port 115, and in that case, the sample storage container can be kept in a low pressure state with a desired type of gas. Further, liquid in addition to the gas may be introduced into/out of the gas inlet/outlet port described above and a pipe.

The sample storage container includes a current inlet terminal 116 through which electric signals are transmitted to/received from a vicinity of the sample 6 and the like. An adhesive, an O-ring, a packing or the like is arranged between the current inlet terminal 116 and the storage container 100 to keep the inside of the storage container airtight. The electric signals are transmitted to/received from the vicinity of the sample 6 from the current inlet terminal 116 via wirings or the like (not shown). The current inlet terminal 116 can be used for electric field application, a temperature heater, temperature measurement or the like. In addition, a detection element may be arranged inside the sample storage container and a signal line from the detection element may be connected to the current inlet terminal 116, to allow signals generated inside the sample storage container to be obtained. Thus, the current inlet terminal 116 can also be used as an electric signal outlet terminal. Specifically, if the sample table 102 under the sample 6 is arranged as a detection element such as a scintillator or a semiconductor detector which converts the charged particle beams to light or electric signals, the transmitted charged particle beams from the sample 6 can be received to obtain information on inside the sample. Since the inside of the sample storage container is in a state of atmosphere or a state of gas, when the information on inside the sample is detected, a distance between the sample and the detection element is desirably made shorter than a distance at which most of the transmitted charged particle beams scatter. In other words, a mean free path of the transmitted charged particle beams need to be shortened. A distance between the diaphragm and the sample and an allowable distance between the sample and the detector may change based on an irradiation condition such as acceleration voltages of the charged particle beams, but the distances need to be equal to or less than 1 mm. Therefore, the sample 6 is desirably arranged on the detection element directly. Alternatively, the sample may be arranged on a thin mesh having a thickness equal to or less than 1 mm.

<Description of Charged Particle Beam Apparatus>

Figure 3:
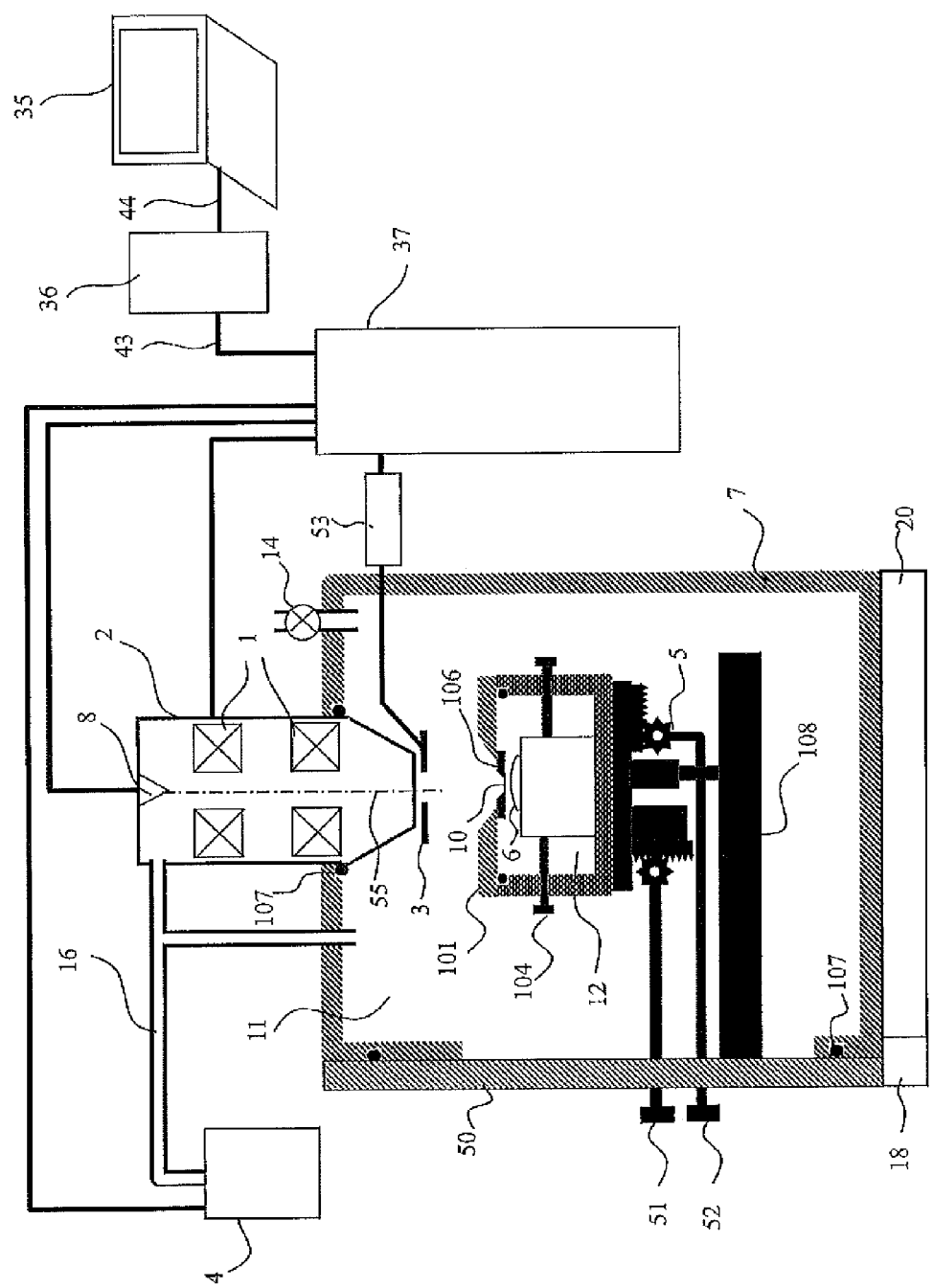
FIG. 3 is an explanatory diagram of a charged particle microscope in the embodiment 1.

Next, FIG. 3 shows the sample storage container arranged inside a charged particle microscope apparatus. The charged particle microscope is mainly configured to include a charged particle optical column 2, a casing 7 (also referred to as a vacuum chamber below) that supports the charged particle optical column with respect to an apparatus installation surface, and a control system that controls these elements. When the charged particle microscope is used, a vacuum pump 4 evacuates the air inside the charged particle optical column 2 and inside the casing 7. The control system also controls turning on/off of the vacuum pump 4. In FIG. 3, a single vacuum pump 4 is shown, but two or more vacuum pumps may be employed.

The charged particle optical column 2 is configured to include a charged particle source 8 that generates charged particle beams, an optical lens 1 that focuses the generated primary charged particle beams to lead to a lower part of the charged particle optical column and that makes the primary charged particle beams scan on the sample 6, and other elements. The charged particle optical column 2 is arranged so as to project into the casing 7 and is fixed to the casing 7 via the vacuum sealing member 107. At an end of the charged particle optical column 2, the detector 3 is arranged which detects the secondary charged particles (such as secondary electrons or reflective electrons) obtained by irradiating the primary charged particle beams. The detector 3 may be arranged anywhere in the casing 7 instead of the position shown in FIG. 3, and a plurality of detectors can be arranged. The charged particle optical column 2 includes, for example, a deflector, an object lens, a diaphragm etc., but may include other lenses, electrodes and detectors, or may be partially different from the above structure. The structure of the charged particle optical column is not limited to the structure described above.

The secondary charged particle beams such as reflective charged particles or transmitted charged particles are emitted from the inside or the surface of the sample based on the primary charged particle beams that transmit or pass the diaphragm 10 to arrive at the sample 6. The detector 3 detects the secondary charged particles. The detector 3 is a detection element that can detect and amplify the incoming charged particle beams with energy of several keV to several ten keV. For example, the detector 3 is a semiconductor detector made of semiconductor material such as silicon, a scintillator that can convert charged particle signals to light on or inside a glass surface. A sample image is generated by associating the signals detected by the detection element with irradiation positions of the charged particle beams.

The charged particle microscope of the present embodiment includes, as the control system, a computer 35 used by an operator, a high-level controller 36 that is connected with the computer 35 for communication, and a low-level controller 37 that controls an evacuation system and a charged particle optical system etc. based on commands transmitted from the high-level controller 36. The computer 35 includes a monitor on which operation screens (GUI) of the apparatus are displayed and input devices for the operation screens such as a keyboard and a mouse. The high-level controller 36, the low-level controller 37 and the computer 35 are connected via communication lines 43, 44, respectively.

The low-level controller 37 is used to transmit/receive control signals for controlling the vacuum pump 4, the charged particle source 8, the optical lens 1 and the like, and further converts output signals from the detector 3 to digital image signals to transmit to the high-level controller 36. In FIG. 3, the output signals from the detector 3 are transmitted to the low-end controller 37 via an amplifier 53 such as a preamplifier. The amplifier is not necessarily required.

Analog circuits and digital circuits may be mixed in the high-level controller 36 and the low-level controller 37, and the high-level controller 36 and the low-level controller 37 may be integrated. FIG. 3 shows just an example of the structure of the control system, and modifications of the control unit, the valves, the vacuum pump or the wirings for communication belong to a scope of the charged particle microscope of the present embodiment as long as intended functions in the present embodiment are achieved.

The charged particle microscope of the present embodiment includes a controller (not shown) that controls an operation of each part and an image generator (not shown) that generates images based on the signals outputted from the detector further. The controller and the image generator may be configured as hardware with a dedicated circuit board, or may be configured as software executed by the computer 35. In a case where those parts are formed as hardware, a plurality of calculators that execute processes are integrated on a wiring board, a semiconductor chip or a package. In a case where those parts are formed as software, a high speed general purpose CPU is arranged in the computer to execute a program that implements desired calculation processes. An existent apparatus can be upgraded with a recording medium on which the program is recorded. In addition, these pieces of apparatus, the circuits and the computer are interconnected via a wired or wireless network to transmit/receive data among them.

The casing 7A is connected with the vacuum pipe 16, one end of which is connected to the vacuum pump 4, and a space 11 inside the casing 7 can be maintained in the vacuum state. In addition, the casing 7 includes a leak valve 14 that opens the space 11 inside the casing 7 to the atmosphere so that the inside of the casing 7 can be opened to the atmosphere when the sample storage container 100 is introduced inside the apparatus. The leak valve 14 may not be arranged or two or more leak valves may be employed. In addition, the leak valve 14 may be arranged at other different positions in the casing than the position shown in FIG. 3. Further, the casing 7 includes an opening on a side surface through which the sample storage container is taken in and taken out. The inside of the apparatus is kept in the vacuum airtightly by a lid member arranged on the opening and the vacuum sealing members 107.

Figure 4:
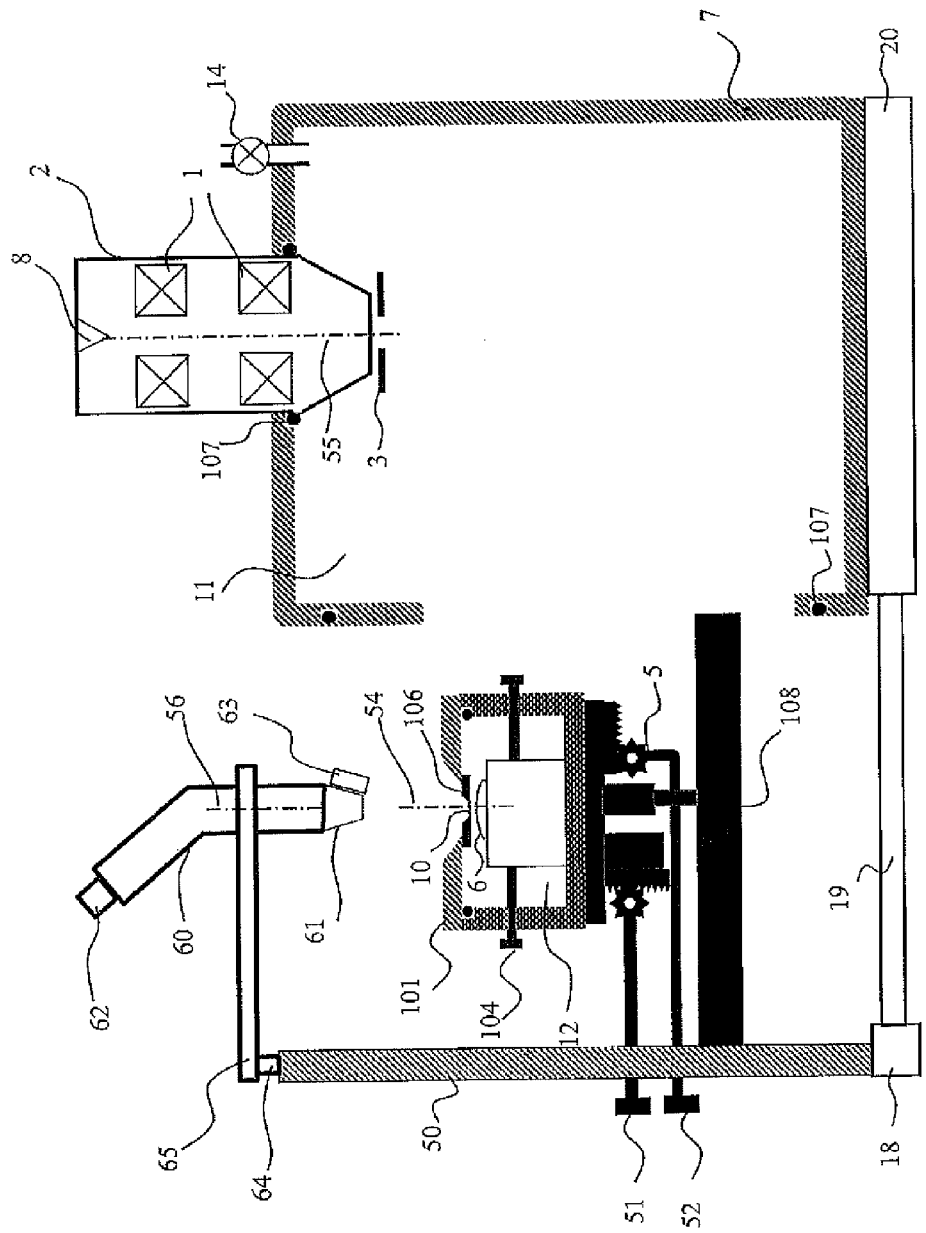
FIG. 4 is an explanatory diagram of sample position adjustment in the embodiment 1.

The lid member 50 on the side surface of the casing 7 can separate the atmospheric pressure states outside the apparatus and inside the casing 7 from each other. The vacuum sealing member 107 is arranged between the lid member 50 and the casing 7, and the lid member 50 is detachably fixed to the casing 7 via a vacuum sealing member 125. The charged particle microscope of the present embodiment includes a stage 5 as a moving device for the sample storage container. The stage 5 is used to change a positional relation between the sample and the charged particle optical column after the above-mentioned sample storage container is put into the casing 7. A support plate 108 is attached as a bottom plate for supporting the lid member 50 and the stage 5 is fixed thereon. A support member 18 for the lid member and a bottom plate 20 are respectively arranged on a bottom surface of the casing 7 and a lower surface of the lid member 50. The support member 18 for the lid member is detachably fixed with respect to the bottom plate 20, and as shown in FIG. 4, the lid member 50 and the support member 18 for the lid member can be detached out of the casing 7 as a whole.

A support 19 is arranged in the bottom plate 20, which is used as a guide for withdrawing the lid member 50 when the sample storage container is removed. In a normal observation state, the support 19 is accommodated in an accommodation section formed in the bottom plate 20, and is configured to extend in a direction to which the lid member 50 is withdrawn when the sample storage container is removed. In addition, the support 19 is fixed to the support member 18 for the lid member so that the lid member 50 does not separate completely from the main body of the charged particle microscope when the lid member 50 is removed from the casing 7. Thus, the stage 5 or the sample 6 can be prevented from falling off.

The stage 5 includes an XY driving mechanism in a surface direction and a Z-axis driving mechanism in a height direction. The support plate 108 is attached to extend in the casing 7 toward a facing surface of the lid member 50. Support shafts extend from the Z-axis driving mechanism and the XY driving mechanism, respectively, and are connected to an operation tab 51 and an operation tab 52 which are arranged on the lid member 50, respectively. The operator can operate these operation tabs to adjust a position of the sample storage container relative to the charged particle optical column. Here, as described above, the position adjustment mechanism is arranged in the sample storage container, and this position adjustment mechanism is movable independently from the stage. The position adjustment mechanism in the sample storage container is used to adjust the sample and the diaphragm, and the stage is used to adjust alignment of the charged particle beam optical column and the sample storage container. In addition, as described later, the lid member 50 may be configured to include an optical microscope 60.

<Method of Observing Sample>

Next, a description will be given in detail of a method of arranging the sample inside the sample storage container as described above, arranging the sample storage container inside the charged particle beam apparatus, and irradiating the charged particle beams on the sample under the atmospheric pressure or the gas atmosphere.

In the first step, the sample 6 is set inside the sample storage container exposed under the atmospheric pressure or the gas atmosphere. At this time, a position where the diaphragm 10 is attached needs to be sufficiently separated from the surface of the sample 6 by adjusting the Z-axis direction of the sample stage 103 so as to avoid the sample 6 from contacting the diaphragm 10 when the lid 101 is attached in the next second step that follows.

In the second step, the lid 101 is attached on the sample storage container to separate the atmosphere outside the storage container from the atmosphere of the inner space. These first and second steps may be performed in a glove box in which the outer space of the storage container is filled with a desired gas, which allows the inside of the storage container to be filled with the desired gas when the lid 101 is attached. In a case where the desired gas needs to be filled after the first step and the second step are performed in an atmospheric space, the desired gas may be introduced through the gas inlet/outlet port 114 arranged in the storage container 100 after the lid 101 is closed.

In the third step, a relative position between the sample 6 and the diaphragm 10 is changed with the operation tabs arranged on the storage container 100 while the position of the sample 6 is observed through the diaphragm 10 using an optical microscope or the like. As described above, the diaphragm 10 is very thin to transmit light, to allow the sample 6 to be observed through the diaphragm. While checking the position of the sample 6 that can be observed through the diaphragm 10, the operator adjusts an area to be observed to a position just under the diaphragm 10.

After the XY-axis is adjusted first to determine an observation position, the Z-axis is adjusted to move the sample 6 closer to the diaphragm 10. The charged particle beams passing through the diaphragm are scattered due to the atmospheric space or the desired gas space. Under the atmospheric pressure, the mean free path of the charged particle beams is very short. Therefore, the distance between the diaphragm 10 and the sample 6 is desirably shorter than the mean free path. Specifically, the distance needs to be equal to or less than about 1000 μm. However, when the sample 6 is moved closer to the diaphragm 10 and the sample 6 contacts the diaphragm 10 by mistake, the diaphragm 10 may be broken. Therefore, careful attention is needed when the sample 6 is moved closer to the diaphragm 10 in the present step.

In the third step, a technique may be used to use the optical microscope to have a window frame around the diaphragm 10 coming into focus, to move the sample 6 closer to the diaphragm 10, and when the sample 6 substantially comes into focus, to stop moving the sample 6 closer to the diaphragm 10. This allows the sample 6 to be moved very close to the diaphragm 10.

In addition, as described in FIG. 4, the optical microscope used in the third step may be arranged in the charged particle beam apparatus. For example, a support 64 is arranged on an upper side of the lid member 50 and the optical microscope 60 is arranged on a support base 65. The optical microscope 60 includes an objective lens 61, an ocular lens 62 and a light source 63. In a state that the charged particle beam apparatus has had a vacuum leak inside thereof to have the atmospheric space, the lid member 50 is pulled out and the sample storage container is attached to the stage 5. Then, the stage 5 is adjusted to align an optical axis 56 of the optical microscope with a center position 54 of the diaphragm. After the adjustment, the third step mentioned above is implemented with the optical microscope 60. The optical microscope may be arranged on the support plate 108, the casing 7 or the like instead of the lid member 50. With the optical microscope arranged in the apparatus, when the sample position needs to be adjusted, the sample storage container can be adjusted, while being on the stage 5, with the operation tabs. Therefore, the sample position can be adjusted at high throughput. In addition, the operation tabs are arranged on the side surface of the container, and this allows the above operation to be implemented easily. Further, in a case where an install position of the optical microscope with respect to the lid member 50 is the same as a set position of the charged particle optical column with respect to the lid member when the lid member 50 is closed, when the lid member 50 and the support plate 108 are put in the casing 7 as a whole after the sample storage container is adjusted to the position where the sample is observed, the center position 54 of the diaphragm and the sample part to be observed are already located on the optical axis of the charged particle optical column, which makes the observation easier.

Note that the optical microscope is not necessarily arranged in the apparatus, and the sample storage container may be arranged on a table of the optical microscope located outside the charged particle beam apparatus to observe and to adjust the sample position.

Figure 5:
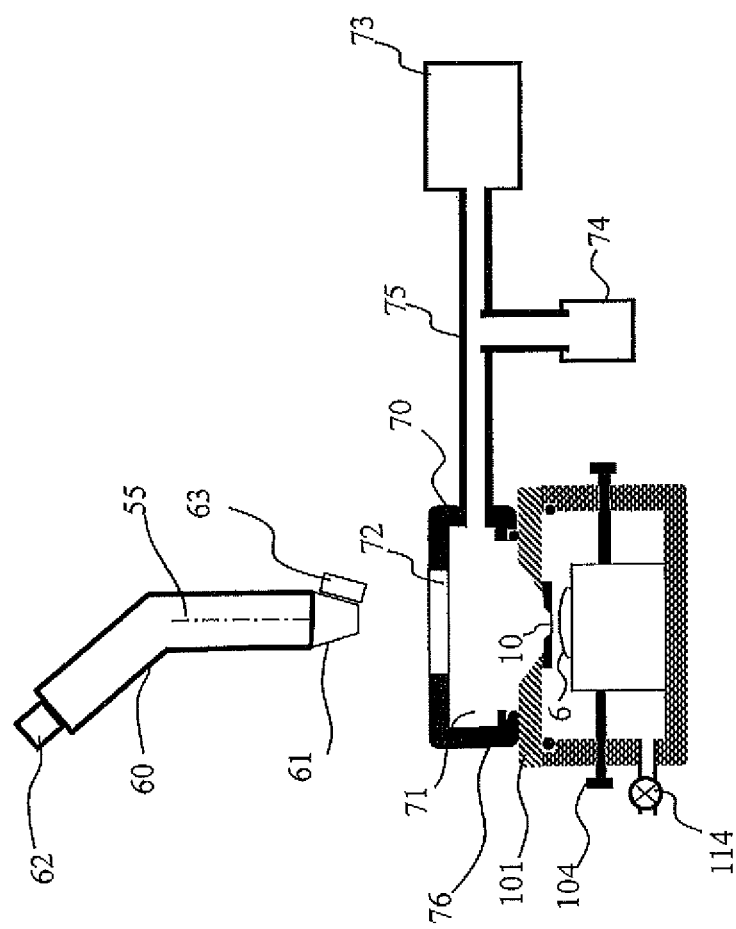
FIG. 5 is an explanatory diagram for a method of confirming if the diaphragm is broken or not.

In the fourth step, the diaphragm of the sample storage container is checked if it is broken or not. FIG. 5 shows an exemplary structure for checking breakage. FIG. 5 shows an example in which a U-shaped lid 70 covers the sample storage container under the optical microscope 60 to cover the diaphragm 10. The lid 70 has a shape to form a closed space with the diaphragm in a state that the lid 70 covers the diaphragm 10, and has a window 72 for observation just above the diaphragm through which the diaphragm can be observed with the optical microscope in a state that the lid 70 covers the diaphragm. FIG. 5 shows a space 71 to be evacuated, the window 72 through which the diaphragm can be checked with the optical microscope 60, a vacuum pump 73 connected to the lid 70 via a pipe 75, and a vacuum meter 74. A vacuum sealing member 76 (not shown) is arranged between the window 72 and the lid 70. When the vacuum pump 73 is activated, the diaphragm 10 is pulled upward in FIG. 5. If the diaphragm is not broken, the vacuum meter 74 should measure a desired level of vacuum in the space 71. With the level of vacuum, the diaphragm can be confirmed not to have breakage. In addition, breakage of the diaphragm may be checked based on time to reach the desired level of vacuum. If the diaphragm is broken, the vacuum meter 74 can reflect a situation such that the time to reach the desired level of vacuum is delayed, or the like. As another method, if the valve 114 of the sample storage container is open and the diaphragm is broken, the space 71 cannot be in the vacuum. Thus, the diaphragm can be checked for breakage. Note that, whether the diaphragm 10 is broken or not may be checked with the optical microscope 60 when the sample position is adjusted in the third step. For example, whether the diaphragm 10 is broken or not may be checked by checking wrinkles of the diaphragm which should be normally formed, dirt or foreign objects on the diaphragm, or a mark on the diaphragm which is intentionally marked. In that case, the fourth step is not necessarily required. Breakage of the diaphragm is checked and confirmed preliminary, that is, before the diaphragm is set in the casing 7 in a vacuum state, to reduce a possibility of contaminating inside the casing and inside the charged particle optical column using a broken diaphragm by mistake.

In the fifth step, the sample storage container is set on the stage 5 and the casing 7 is sealed with the lid member 50, then, an inner part 11 of the casing 7 is evacuated by the vacuum pump. At this time, atmospheric pressure or a desired type of gas and desired pressure are maintained inside the sample storage container.

In the sixth step, the position of the sample storage container is checked based on an image obtained with the irradiated primary charged particle beams.

In the seventh step, the stage 5 is adjusted such that the center position 54 of the diaphragm aligns with an optical axis 55 of the charged particle optical column.

In the eighth step, the sample 6 is irradiated with the charged particle beams that passes through or transmits the diaphragm 10. Thus, the sample position checked in the third step can be observed in the image by the charged particle microscope. If the position of the sample 6 observed through the diaphragm 10 needs to be adjusted, the inner part 11 of the casing 7 is opened to the atmosphere, and the process returns to the third step, where the position of the sample is adjusted with the optical microscope.

The area of the diaphragm is very small due to a requirement in which the diaphragm should be maintained with the differential pressure between the atmospheric pressure and the vacuum. Therefore, in the methods of the conventional references, the observable area is very limited due to the area of the diaphragm. On the other hand, in the present embodiment, the sample can be independently moved freely from the diaphragm while the sample position is checked with the optical microscope. Therefore, various parts of the sample can be observed. Specifically, this adjustment operation for the observation position can be performed while a local atmosphere is maintained, resulting in improving operator's convenience greatly.

<Contact Prevention Member>

Figure 6A:
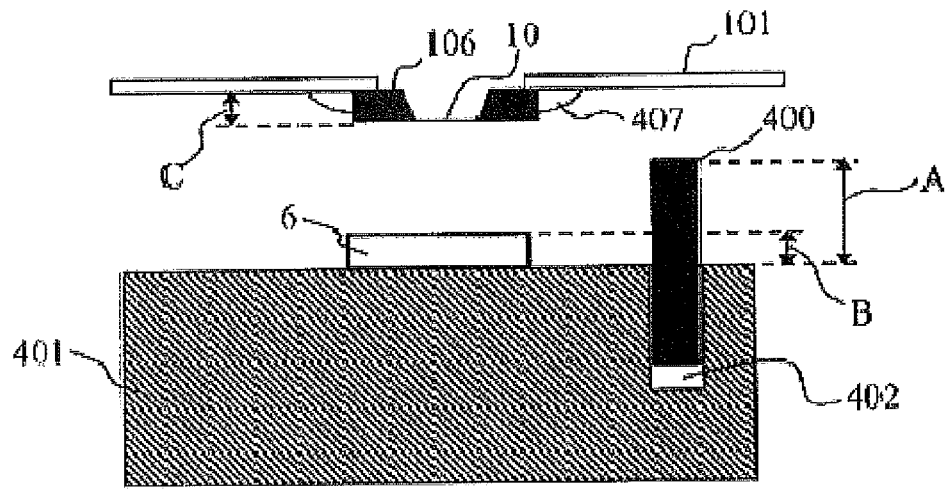
FIGS. 6A and 6B are explanatory diagrams of a contact prevention member.
Figure 6B:
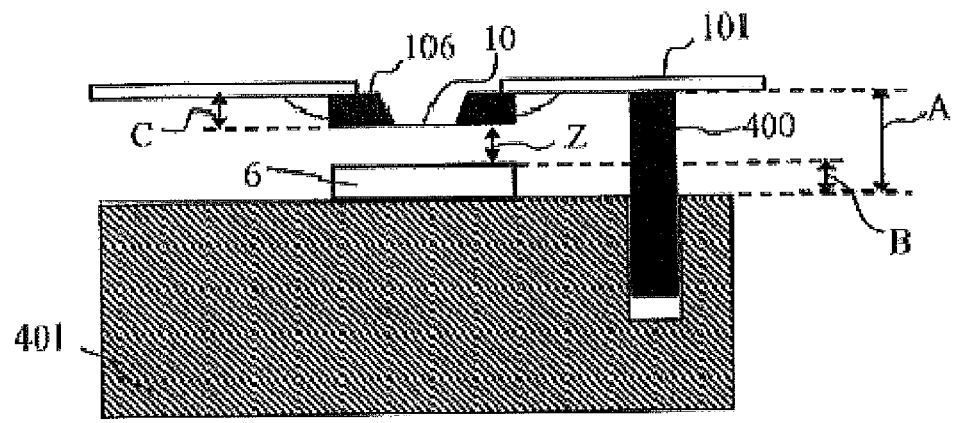

As described above, the distance between the diaphragm 10 and the sample 6 needs to be equal to or less than about 1000 μm. When the operation tabs of the sample storage container are operated, the sample may hit the diaphragm by mistake, resulting in breaking the diaphragm. In the present embodiment, a contact prevention member that prevents the sample 6 from contacting the diaphragm 10 is arranged inside the sample storage container. Referring to FIG. 6, the contact prevention member will be explained. For simplifying a description, FIG. 6 only shows a vicinity of the diaphragm and a vicinity of the sample. In the present embodiment, a contact prevention member 400 is arranged between the sample 6 and the diaphragm 10. The contact prevention member 400 is arranged to project from a sample table 401, with a tip of the contact prevention member 400 always being arranged closer to the diaphragm than the sample 6 as shown in FIG. 6A. The sample table 401 is arranged on the sample stage 103. As shown in FIG. 6B, when the position of the sample table 401 is moved closer to the diaphragm 10, the contact prevention member 400 contacts the lid 101 beforehand, thereby preventing the sample 6 from contacting the diaphragm 10. On the other hand, a height B of the sample 6 may be changed according to the sample. Therefore, an adjustment mechanism is needed for adjusting a height A of the contact prevention member 400 according to the height of the sample B. Then, for example, the contact prevention member 400 may be formed with a male screw and the sample table 401 may be formed with a female screw. The male screw of the contact prevention member 400 is turned into the female screw in the sample table 401 so that the height A of the contact prevention member 400 can be changed. Note that the adjustment mechanism can be any mechanism to move the position of the contact prevention member 400, where the sample may contact the diaphragm in an optical axis direction of the charged particle optical column.

Assuming that a distance between the sample table 401 and the sample is B and a distance between the lid 101 and the diaphragm 10 is C, if the contact prevention member 400 is brought in contact with the lid 101, a distance Z between the diaphragm and the sample is calculated as follows:

$$Z=(A-B)-C \qquad \text{[Formula 1]}$$

As described above, in view of the mean free path of the charged particle beams, the distance Z between the diaphragm and the sample is desirably shorter than or equal to 1000 μm. In addition, the following formula must be satisfied so as not to bring the sample 6 into contact with the diaphragm 10.

$$Z=A-B>C \qquad \text{[Formula 2]}$$

Further, FIGS. 6A and 6B show a vacuum sealing member 407 for sealing in a vacuum between the lid 101 and the diaphragm 10. The vacuum sealing member 407 is, for example, an adhesive or a double sided tape. If the vacuum sealing member is present between the lid 101 and the diaphragm 10, the distance C amounts to a distance that adds the thickness of the vacuum sealing member between the lid 101 and the diaphragm 10 to the thickness of the diaphragm 10.

If each distance A, B and C are unknown, each of them can be observed with a device that can be arranged outside the apparatus to measure by a laser or light the heights of the sample table 401 on which the sample 6 is set and the lid 101 on which the diaphragm 10 is held. If the sample 6 and the diaphragm 10 each having the same height are always used, once the distance A from the sample table 401 to the contact prevention member 400 is determined, the contact prevention member 400 does not need to be adjusted again. As described above, the contact prevention member has an effect of keeping the distance from the diaphragm to the surface of the sample constant by making the contact prevention member in contact with the diaphragm holding member.

A series of steps will be shown below from the sample being set until the lid 101 of the sample storage container being closed. First, the sample 6 is set on the sample table 401. Secondly, the contact prevention member 400 is inserted into the female screw 402. Here, the distance from the surface of the sample 6 to an upper part of the contact prevention member 400 is expressed by the member (A–B) shown in [Formula 1] or [Formula 2]. As described above, if the distance (A–B) needs to be measured precisely, the distance is measured or recorded using the device that can measure the height by the laser or light. Thirdly, the sample table having the contact prevention member 400 and the sample 6 thereon is arranged on the sample stage 5 in the sample storage container. Fourthly, the lid 101 of the sample storage container is closed. Finally, the contact prevention member 400 is brought in contact with the lid 101 by moving the sample 6 closer to the diaphragm 10 by the sample stage 103. Thus, the distance between the sample 6 and the diaphragm 10 can be set to the distance Z mentioned above.

Figure 7A:
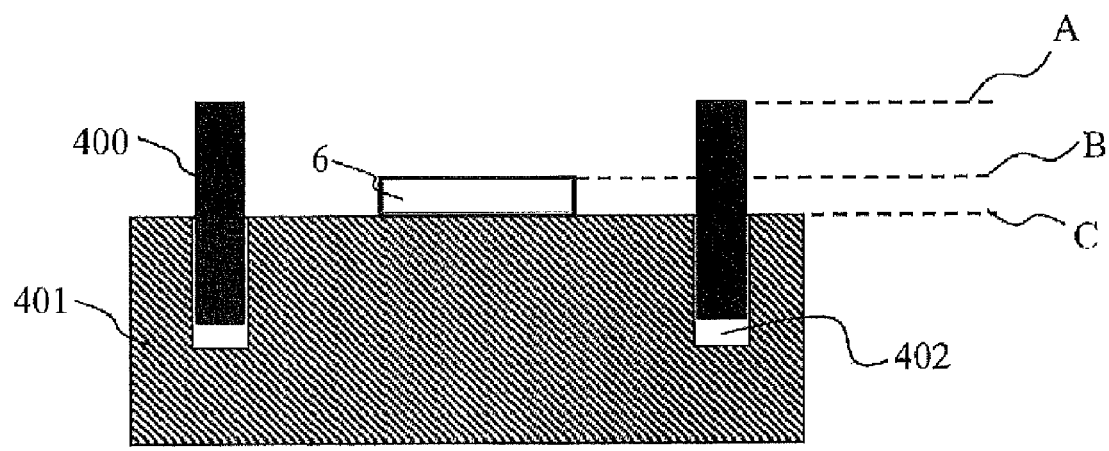
FIGS. 7A and 7B are explanatory diagrams of the contact prevention member.
Figure 7B:
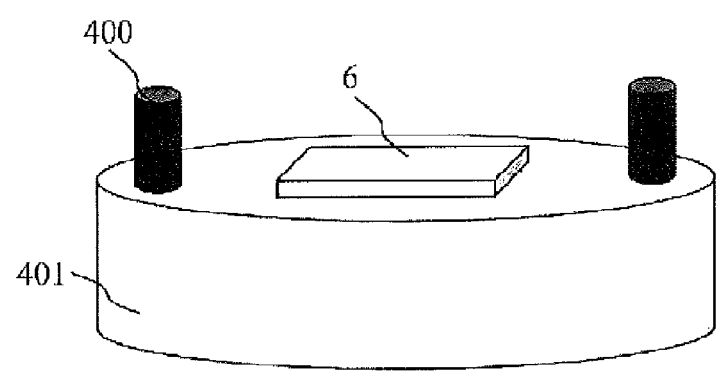

FIGS. 7A and 7B show an example having a plurality of contact prevention members 400. FIG. 7A is a cross sectional side view and FIG. 7B is a perspective view. One contact prevention member 400 is arranged in FIGS. 6A and 6B, but two contact prevention members 400 may be arranged as shown in FIGS. 7A and 7B. Arranging two contact prevention members can reduce a possibility of the sample 6 contacting the diaphragm 10 when the sample table inclines against the diaphragm or the like, compared with arranging one contact prevention member.

Figure 8:
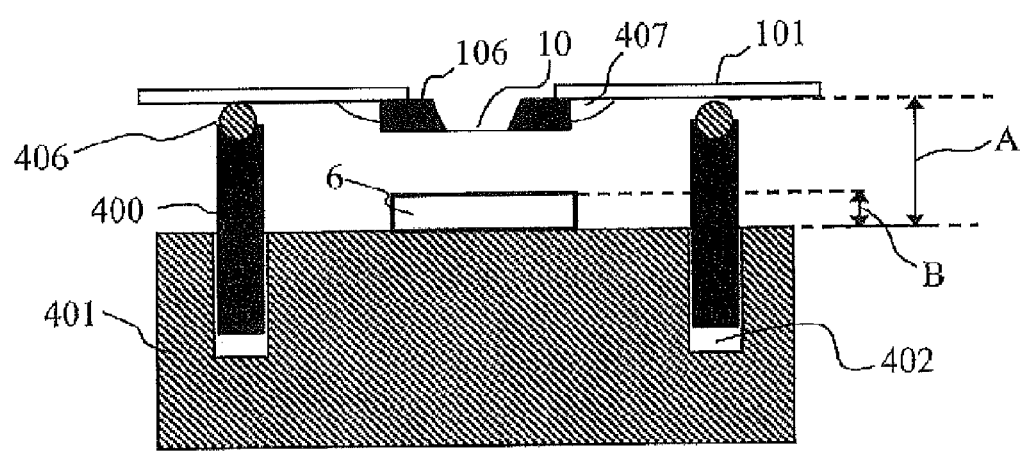
FIG. 8 is an explanatory diagram of the contact prevention member.

In addition, as shown in FIG. 8, ball bearings 406 may be arranged on the contact prevention members 400. In this case, the ball bearings 406 come in contact with the lid 101. Having the ball bearings 406 arranged at tips of the contact prevention members 400 allows the sample to be moved in a horizontal direction and a direction perpendicular to the paper in FIG. 8 in a state that the contact prevention members 400 are in contact with the lid 101. Here, any member not limited to the ball bearing may be referred to as a fine adjustment member, if the member can move the the sample table in a vertical direction of the optical axis of the charged particle optical column in a state that the distance between the sample table and the lid 101 (or the distance between the surface of the sample and the diaphragm) is restricted so as to be constant by the contact prevention members 400. If friction between the contact prevention member 400 and the lid 101 is small, the fine adjustment member is not limited to the ball bearings. For example, material having a small coefficient of friction may be used among organic substances such as a fluororesin, represented by polytetrafluoroethylene or the like, or a contact area may be made as small as possible so as to allow the contact prevention member 400 to slide on the lid 101 easily.

Figure 9A:
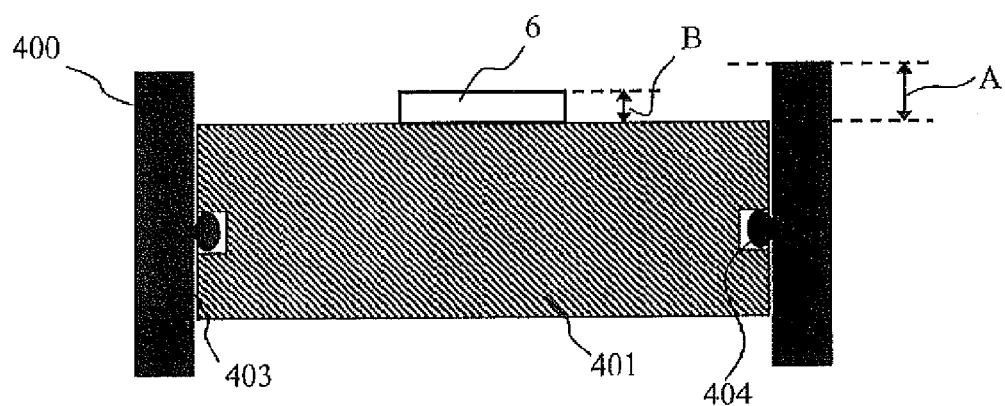
FIGS. 9A and 9B are explanatory diagrams of the contact prevention member.
Figure 9B:
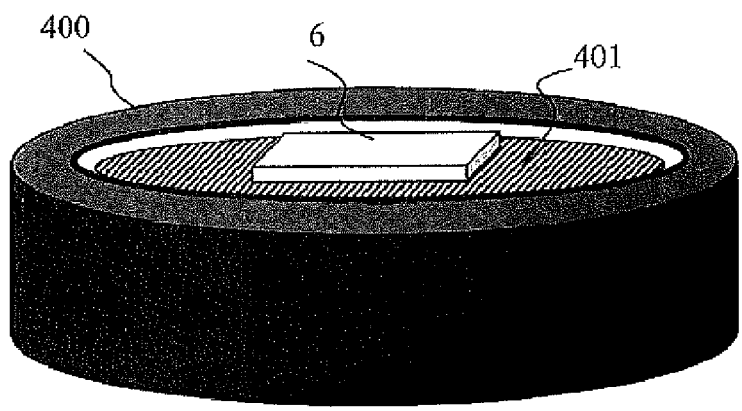

In addition, FIGS. 9A and 9B show another example. FIG. 9A is a cross sectional side view and FIG. 9B is a perspective view. Thus, the contact prevention member 400 may be arranged around the entire sample table 401. In this case, for example, a male screw is formed on an outer periphery of the sample table 401 and a female screw is formed on an inner periphery of the contact prevention member 400. The contact prevention member 400 can be arranged at a position higher than the surface of the sample 6 by rotating the sample table 401 with respect to the contact prevention member 400. Further, a slippage prevention member 404 made of rubber or the like may be arranged between the sample table 401 and the contact prevention member 400 in order to prevent the screws from being loosen to cause positional deviation at a boundary 403. In this structure, the contact prevention member 400 can be easily adjusted because its size is larger than that in FIGS. 7A and 7B. Still further, the ball bearing 406 or a projection member (not shown) may be further added on an upper side of the contact prevention member 400 shown in FIGS. 9A and 9B, and the structure belongs to a category of the charged particle microscope according to the present embodiment as long as the intentional function of the present embodiment is achieved.

Figure 10:
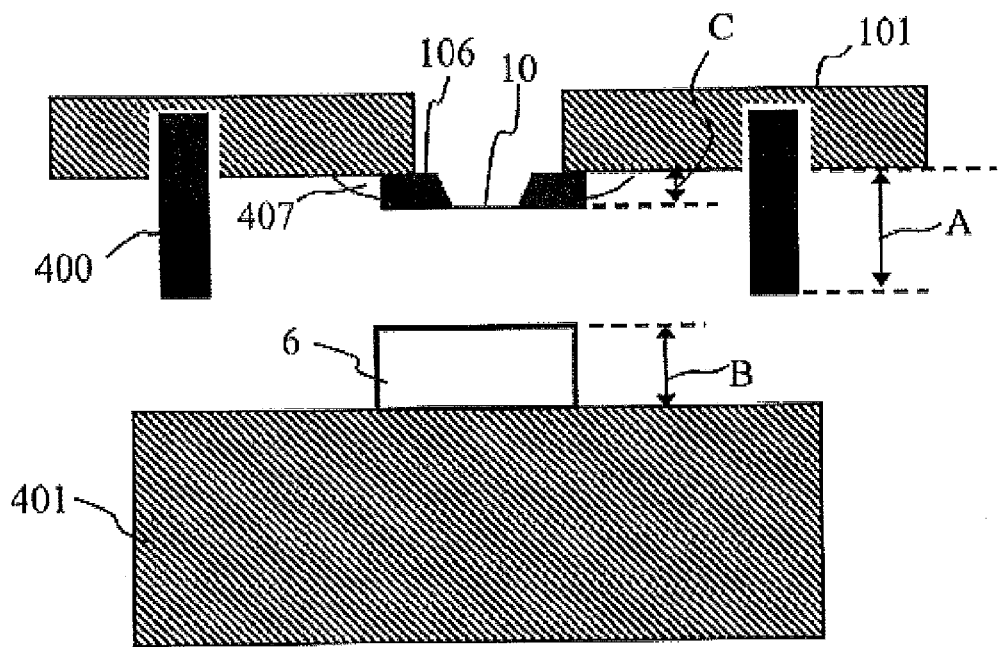
FIG. 10 is an explanatory diagram of the contact prevention member.

In addition, the contact prevention member 400 may be arranged in the lid 101 as shown in FIG. 10. In this case, when the height of the sample table 401 is changed, the contact prevention member 400 arranged in the lid 101 of the sample table 401 is brought in contact with the sample table 401. In this case, a flat sample table generally available for a charged particle microscope can be used as is.

In addition, a detection device (not shown) may be arranged which detects the contact prevention member 400 contacting the lid 101. An electrical detection device may be used, for example, which is in a non-conductive state when the sample table 401 and the contact prevention member 400 do not contact the lid 101, and is in a conductive state when they contact each other. Further, a mechanical detection device may be employed, in which either of the members has a mechanical switch to detect when the sample table 401 and the contact prevention member 400 come in contact with the lid 101.

In addition, the contact prevention member 400 may be detachable. If the contact prevention member 400 interferes with the sample when the sample is set or exchanged, the contact prevention member 400 may be once taken out, the sample may be set and the contact prevention member 400 may be attached again.

Embodiment 2

In this embodiment, a structure of an apparatus for adjusting the sample position in the sample storage container inside the charged particle beam apparatus and a method for the same will be described.

Figure 11:
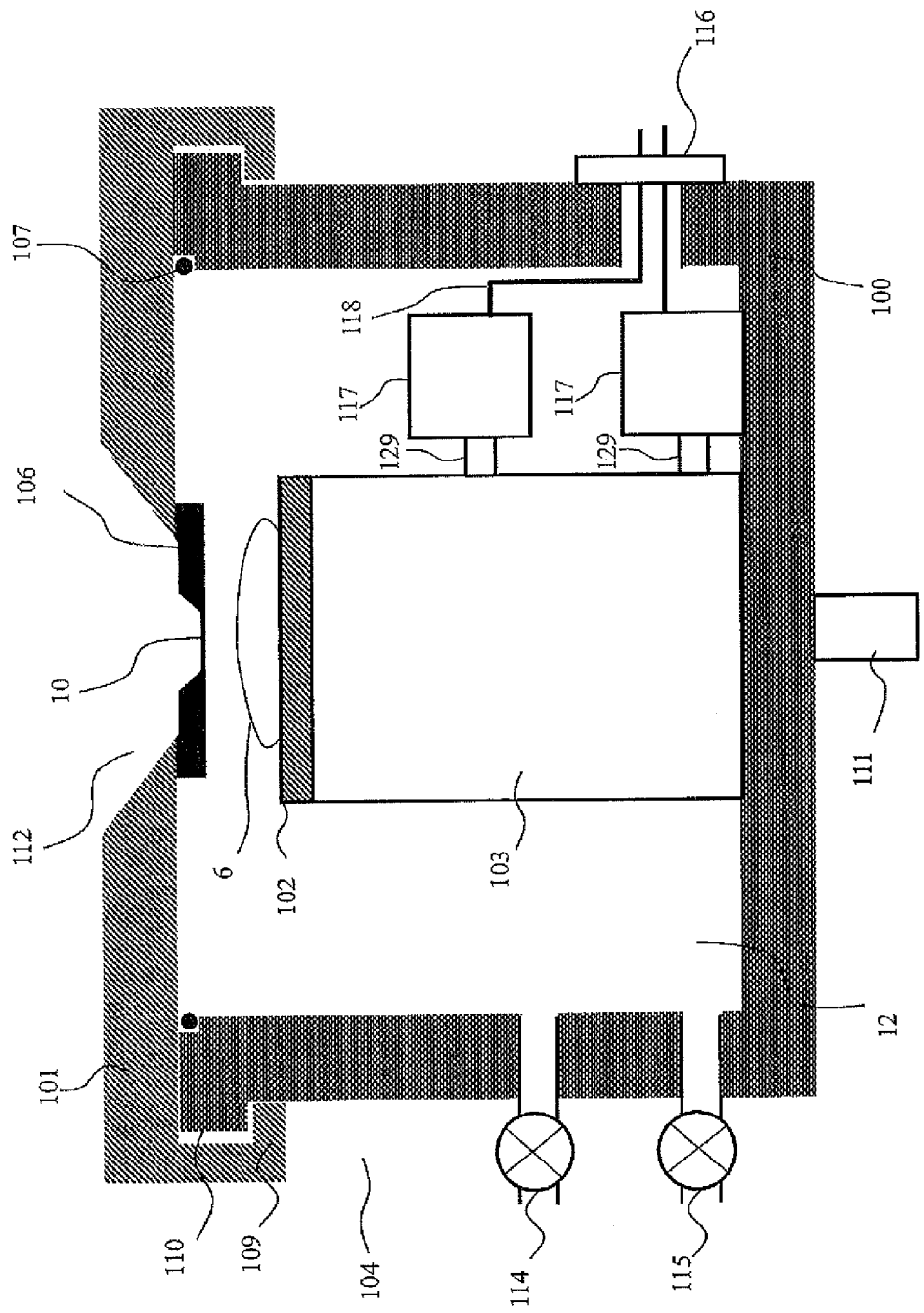
FIG. 11 is a view showing a structure of a sample storage container in an embodiment 2.

FIG. 11 shows an entire structure of the sample storage container of the present embodiment. Hereinbelow, the same parts as those in the embodiment 1 will not be explained. As a difference between the sample storage container shown in FIG. 11 and the embodiment 1, the sample stage 103 is controlled by electrical driving mechanisms 117. A plurality of electrical driving mechanisms 117 are arranged so as to drive the sample stage in various directions such as X, Y and Z directions. The electrical driving mechanisms 117 are driving mechanisms that use, for example, electric motors, piezo elements or the like to convert electric signals into mechanical signals. The electrical driving mechanisms 117 are connected with the sample stage via any mechanical elements 129. The electrical driving mechanisms 117 are connected to the current inlet terminal 116 via wirings 118. With this structure, the position of the sample 6 can be moved by transmitting the electric signals from the outside of the sample storage container to the current inlet terminal 116 in a state that the lid 101 is closed. In addition, the electric driving mechanisms 117 are shown inside the sample storage container, but may be placed outside the sample storage container if they include motors that can be arranged in the vacuum.

Figure 12:
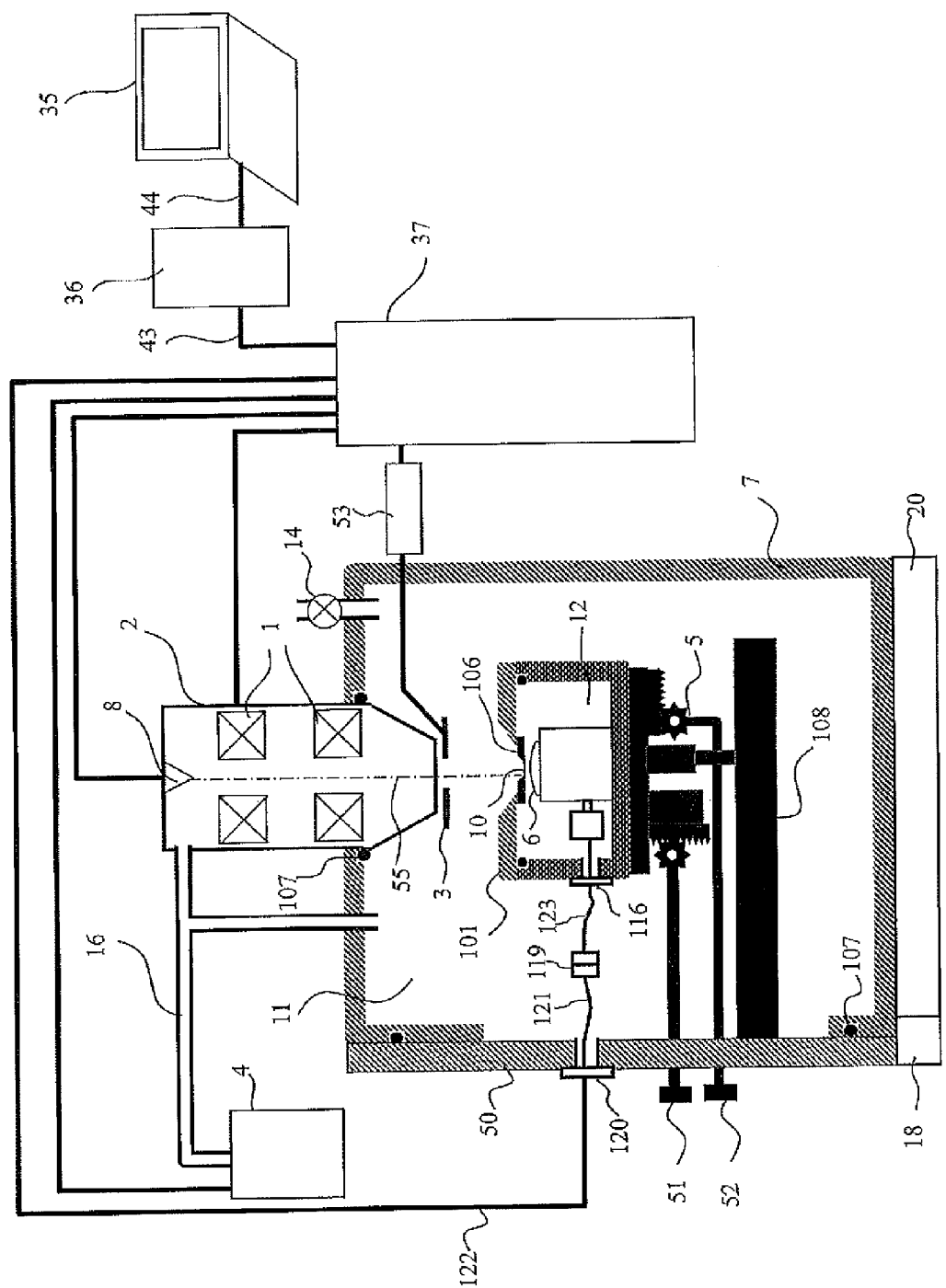
FIG. 12 is an explanatory diagram of a charged particle microscope in the embodiment 2.

Next, FIG. 12 shows the sample storage container arranged inside a charged particle microscope apparatus. The same parts as those in the embodiment 1 will not be explained. The sample storage container having the sample 6 inside with the lid 101 closed is shown as arranged on the stage 5. The lid member 50 for closing the casing 7 of the apparatus includes a hermetic connector 120 for transmitting electric signals to the current inlet terminal 116 of the sample storage container. The hermetic connector 120 is connected to the low-level controller 37 via a wiring 122. The electric signals from the hermetic connector 120 inside the casing 7 are transmitted to the current inlet terminal 116 of the sample storage container via a wiring 121, a connector 119 and a wiring 123. With this structure, since driving signals can be transmitted from the low-level controller 37 to the sample stage 103, the sample stage can be moved under the atmosphere or a desired gas state in the sample storage container arranged inside the casing 7 in the vacuum state. Since the position of the sample 6 just under the diaphragm 10 can be changed while microscopic images are obtained with the charged particle beams, the position adjustment using the optical microscope as shown in the embodiment 1 is not necessary. Therefore, the vacuum state of the casing 7 is not broken every time the observation position of the sample is changed and an observation area can be changed more easily. Note that the sample storage container can be detached from the stage 5 by taking off the connector 119.

Embodiment 3

Figure 13:
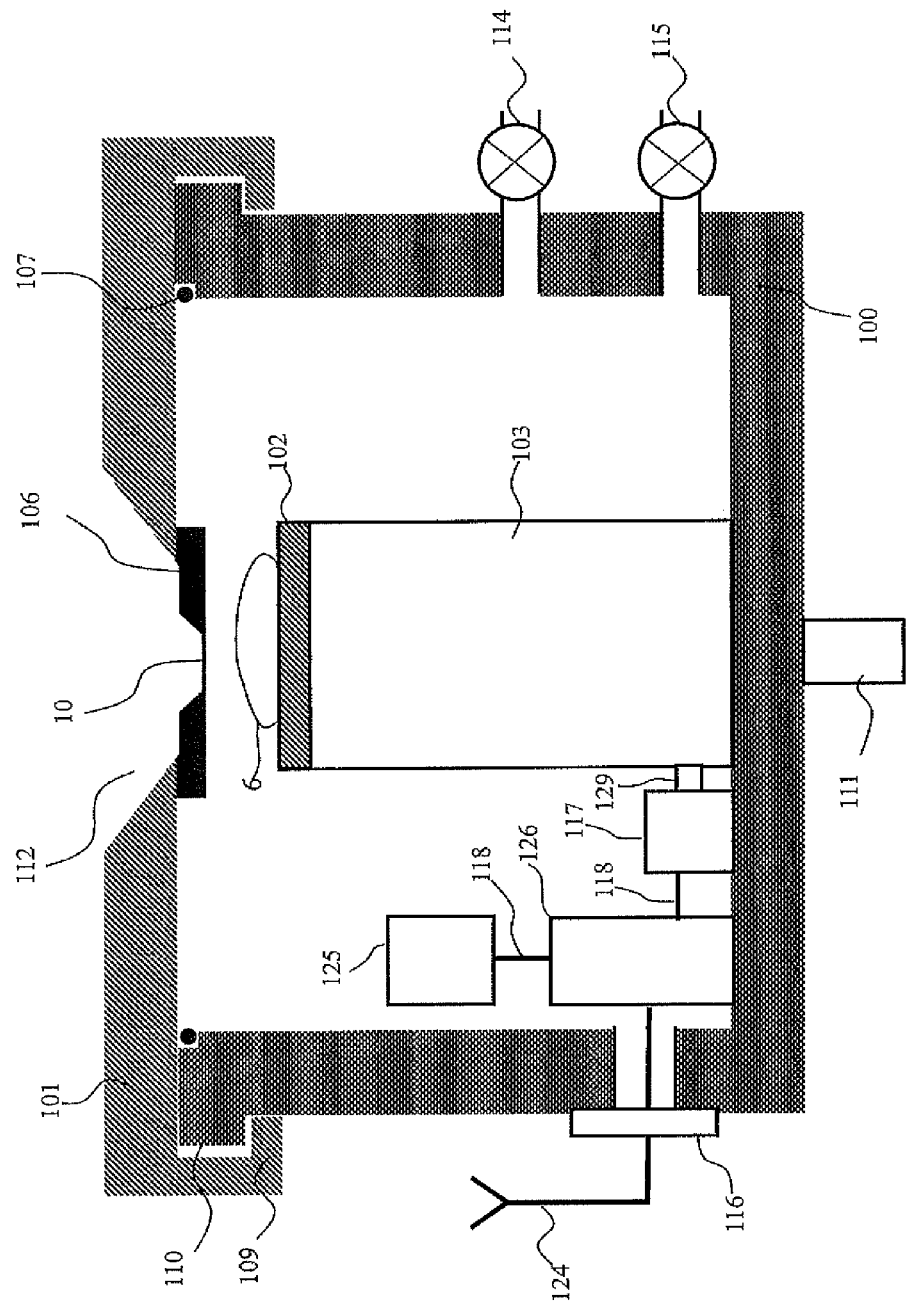
FIG. 13 is a view showing a structure of a sample storage container in an embodiment 3.

FIG. 13 shows an entire structure of the sample storage container according to the present embodiment. Hereinbelow, the same parts as those in the embodiments 1 and 2 will not be explained. In the present embodiment, an example will be described in which the signals for moving the sample stage 103 are transmitted/received via an antenna arranged on the sample storage container. An antenna 124 is arranged in the current inlet terminal 116 arranged on the sample storage container 100. The signals received by the antenna 124 are transmitted to an electric driving controller 126 through the current inlet terminal 116 that is sealed hermetically. The electric driving controller 126 converts the received signals to driving signals to transmit to the electric driving mechanism 117. A battery 125 is arranged inside the sample storage container 100 to supply power to the electric driving controller 126 for the operation above.

Figure 14:
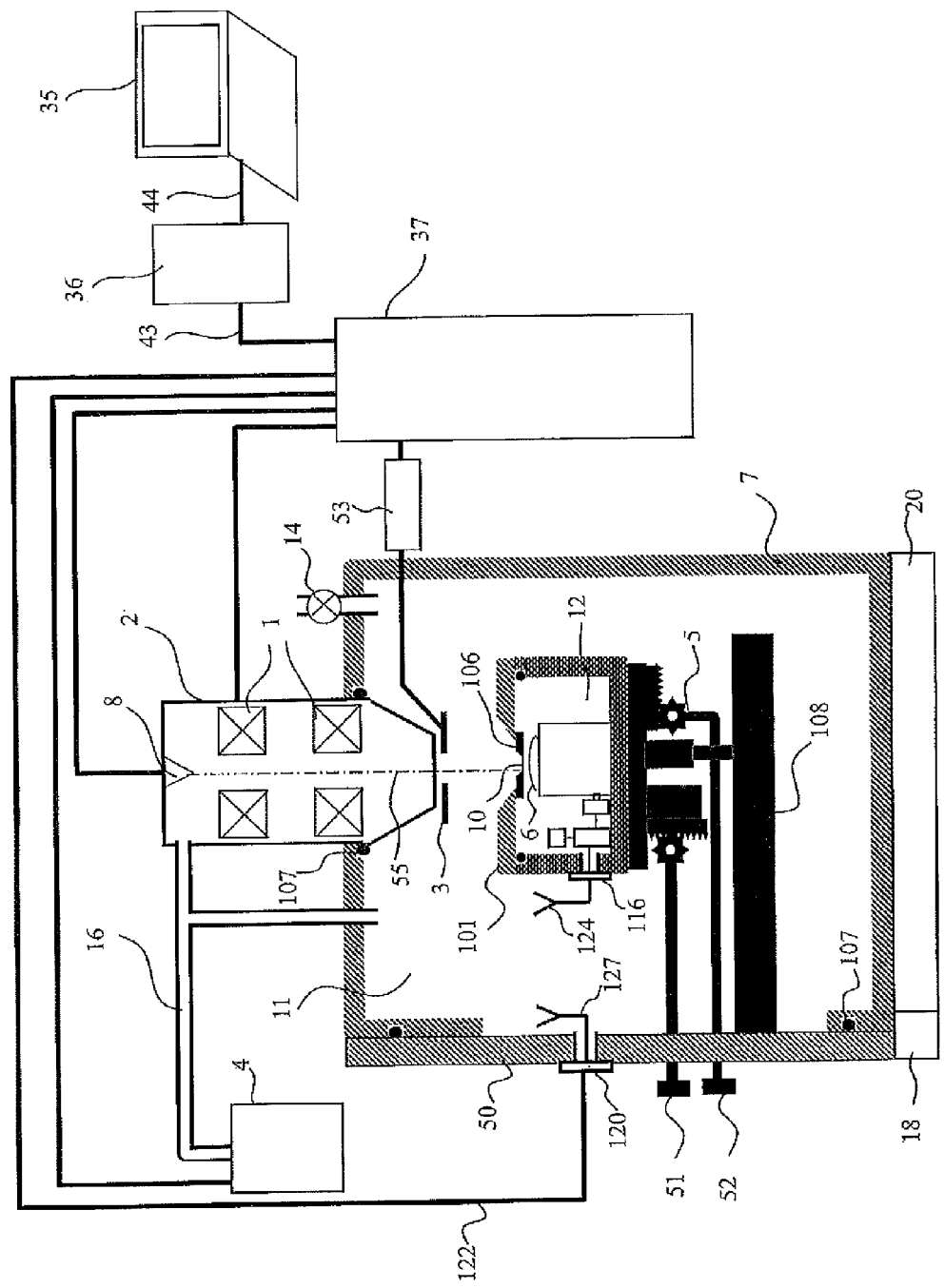
FIG. 14 is an explanatory diagram of a charged particle microscope in the embodiment 3.

The casing 7 and the lid member 50 of the charged particle beam apparatus are generally made of metallic material, which may prevent the signals from being transmitted to the antenna arranged inside the casing 7 from the outside of the apparatus. To deal with the problem, the charged particle beam apparatus suitable for using the sample storage container in the present embodiment is shown in FIG. 14. In this structure, the signals used for adjusting the position of the sample 6 are transmitted from the low-level controller 37 to an antenna 127 inside the casing 7 via the hermetic connector 120. The signals from the antenna 127 are transmitted to an antenna 124 inside the casing in a same manner. In this structure, the signals between the antenna 124 and the antenna 127 are never transmitted/received through the casing 7 made of metal. Therefore, the signals can be transmitted to the antenna 124 certainly.

The signals from the antenna 127 to the antenna 124 are electromagnetic waves or the like. In a case where the electromagnetic waves adversely affect the electronic optical column 2, the antenna 127 may be replaced with a photoradiation transmitter used for transmitting infrared rays or light, and the antenna 124 may be replaced with a photoradiation receiver used for receiving the infrared rays or the light.

With these structures, the position of the sample 6 can be changed from the outside of the sample storage container without using the connector 119 and the wirings as shown in FIG. 12. Therefore, the sample storage container can be taken in/out and exchanged easily, thereby improving usability for the operator.

Embodiment 4

Figure 15:
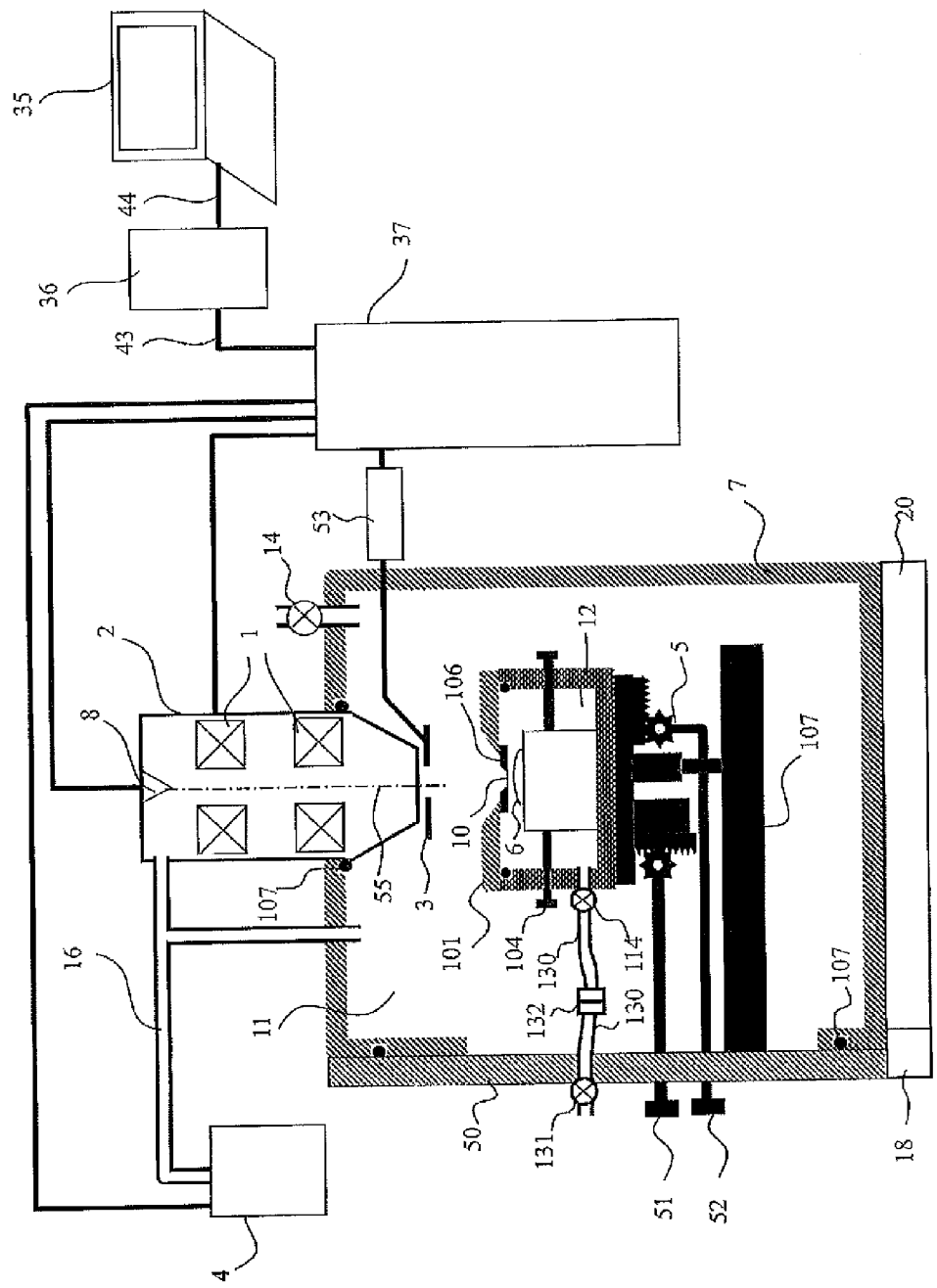
FIG. 15 is an explanatory diagram of a charged particle microscope in an embodiment 4.

In this present embodiment, FIG. 15 will be used to show an apparatus structure in which a desired gas or liquid can be flown through the lid member 50 of the charged particle beam apparatus to the sample storage container. In this structure, the lid member 50 includes a gas inlet/outlet port 131. The gas inlet/outlet port 131 inside the apparatus is connected to the gas inlet/outlet port 114 of the sample storage container via pipes 130 and a pipe connector 132. The sample storage container is set on the stage 5, and then the respective pipes 130 are connected to the pipe connector 132. Consequently, the atmosphere of space outside the charged particle beam apparatus can be coupled with the atmosphere of the inner space of the sample storage container. In addition, a desired gas cylinder or the like may be connected to the gas inlet/outlet port 131 to introduce the desired gas into the inside of the sample storage container. In FIG. 14, only a single pipe system is arranged between the lid member 50 and the sample storage container, but a plurality of pipe systems may be employed. Further, liquid in addition to gas can be introduced through the gas inlet/outlet port and the pipe described above. Still further, since the position of the sample storage container on the stage 5 can be changed, the pipes 130 needs to be flexible or the pipe connector 132 needs to be movable flexibly. With this structure, after the sample storage container is put inside the charged particle beam apparatus, the gas can be introduced.

Note that the present invention is not limited to the embodiments described above and can include various modifications. For example, the above-described embodiments are intended to clearly explain the present invention in detail and are not necessarily limited to those including the entire structures described above. In addition, a part of a structure in one embodiment may be replaced with another structure of another embodiment, and a structure in one embodiment may be added to a structure in another embodiment. Further, another structure may be added to, deleted from, or replaced with a part of the structure in each embodiment. Still further, a part or a whole of each structure, function, processer, processing device and the like mentioned above may be implemented by designing an integrated circuit in hardware. Yet further, each structure, function and the like mentioned above may be implemented in software by a processor interpreting and executing a program that performs respective functions.

Information such as programs that implement respective functions, tables, and files may be stored in a recording apparatus such as a memory, a hard disk, an SSD (Solid State Drive) or a recording medium such as an IC card, an SD card and an optical disk.

In addition, control lines and information lines necessary for explanation are only shown and all the control lines and information lines in a product are not necessarily shown. It may be conceived that almost all structures are actually interconnected.

EXPLANATION OF REFERENCES

1: optical lens 2: charged particle optical column 3: detector 4: vacuum pump 5: sample stage 6: sample 7: casing 8: charged particle source 9: opening surface 10: diaphragm 11: space 12: inner space of a sample storage container 14: leak valve 16: vacuum pipe 18: support member for a lid member 19: support 20: bottom plate 35: computer 36: high-level controller 37: low-level controller 43, 44: communication line 50: lid member 51: operation tab 52: operation tab 53: amplifier 54: center position of a diaphragm 55: optical axis of a charged particle optical column 56: optical axis of an optical microscope 60: optical microscope 61: objective lens 62: ocular lens 63: light source 64: support 65: support base 100: storage container 101: lid 102: sample table 103: sample stage 104: operating section 105: diaphragm 106: diaphragm holding member 107: vacuum sealing member 108: support plate 109: projection 110: projection 111: alignment section 112: opening 113: taper hole 114: gas inlet/outlet port 115: gas inlet/outlet port 116: current inlet terminal 117: electrical driving mechanism 118: wiring 119: connector 120: hermetic seal 121: wiring 122: wiring 123: wiring 124: antenna 125: battery 126: electric driving controller 127: antenna 128: mechanical element 129: mechanical element 130: pipe 131: gas inlet/outlet port 132: pipe connector 400: contact prevention member 401: sample table 402: female screw 403: boundary 404: slippage prevention member 405: contact prevention member 406: ball bearing 407: vacuum sealing member

The invention claimed is:

1. A sample storage apparatus comprising:
    a storage container, including a detachable lid, that encloses and stores a sample within a closed space;
    a diaphragm through which charged particle beams pass through or transmit;
    a position adjustment mechanism that is arranged inside the storage container and that is capable of moving a relative position of the sample to the diaphragm in a horizontal direction and in a vertical direction in a state where an atmospheric state inside the storage container is kept different from an atmospheric state outside the storage container; and
    an interface that is connected to the position adjustment mechanism and allows the position adjustment mechanism to be operated from the outside of the storage container,
    wherein the storage container is configured to be introduced from an outside of a casing of a charged particle beam apparatus into the casing, the casing and the storage container are separate from each other, and the charged particle beam apparatus capturing an image of the sample with a signal obtained by irradiating the charged particle beams on the sample in a state where an atmosphere of a space in which the sample is disposed is separated from an atmosphere inside the casing.

2. The sample storage apparatus according to claim 1, wherein the interface is arranged on a side wall of the storage container.

3. The sample storage apparatus according to claim 1 further comprising a member on a bottom surface thereof that engages and couples with a part of a sample stage of the charged particle beam apparatus.

4. The sample storage apparatus according to claim 1, wherein the storage container includes an inlet/outlet port for introducing gas into an inside of the storage container.

5. The sample storage apparatus according to claim 1, wherein a sample table on which the sample is set or [a] said lid of the storage container includes a contact prevention member that prevents the sample from contacting with the diaphragm.

6. The sample storage apparatus according to claim 5, wherein a height of the contact prevention member is changeable with respect to the sample table.

7. The sample storage apparatus according to claim 1, wherein the storage container includes an electric inlet terminal through which an electric signal is transmitted/received between the outside and the inside of the storage container.

8. The sample storage apparatus according to claim 1, wherein a detector is arranged under the sample that detects charged particles transmitting the sample with irradiation of the charged particle beams on the sample.

9. The sample storage apparatus according to claim 1, wherein the interface is an operation tab that is arranged outside the storage container and the operation tab is mechanically connected to the position adjustment mechanism.

10. The sample storage apparatus according to claim 1 further comprising:
    an electric motor that drives the position adjustment mechanism; and
    a wiring that transmits a signal for driving the electric motor.

11. The sample storage apparatus according to claim 1, wherein the sample storage container includes a battery that supplies electric power for driving the position adjustment mechanism.

12. A charged particle beam apparatus comprising:
    a charged particle optical column that scans a sample by charged particle beams;
    a casing that supports the charged particle optical column and has an inside thereof evacuated while the charged particle beams are irradiated;
    a vacuum pump that forms evacuated areas inside the charged particle optical column and inside the casing; and
    a stage that moves a sample storage container storing the sample in a closed space with respect to the charged particle optical column, wherein
    the sample storage container includes:
    a detachable lid;
    a position adjustment mechanism that can move a relative position of the sample to the diaphragm in a horizontal direction and in a vertical direction in a state where an atmospheric state inside the sample storage container is kept different from an atmospheric state outside the sample storage container;
    an interface that is connected to the position adjustment mechanism and allows the position adjustment mechanism to be operated from the outside of the sample storage container; and
    a diaphragm through which the charged particle beams pass through or transmit,
    the stage includes a part that engages and couples with the sample storage container,
    the position adjustment mechanism is movable independently from the stage, and
    the sample storage container is configured to be introduced from an outside of the casing of the charged particle beam apparatus into the casing, wherein the casing and the storage container are separate from each other, the charged particle beam apparatus capturing an image of the sample with a signal obtained by irradiating the charged particle beams on the sample in a state where an atmosphere of a space in which the sample is disposed is separated from an atmosphere inside the casing.

13. An image acquiring method for acquiring an image of a sample with a signal obtained by irradiating charged particle beams on the sample, the method comprising steps of:

setting the sample inside a sample storage container, including a detachable lid, that is exposed in an atmosphere or a desired gas atmosphere;

separating the atmosphere inside the sample storage container and an atmosphere outside the sample storage container;

checking a relative position of the sample to a diaphragm arranged in the sample storage container with a microscope;

adjusting a position of an observed area of the sample, using a position adjustment mechanism that is arranged inside the sample storage container and can be operated from the outside of the sample storage container, so as to be positioned just under the diaphragm by moving a relative position of the sample to the diaphragm in a horizontal direction and in a vertical direction in a state where an atmospheric state inside the sample storage container is kept different from an atmospheric state outside the sample storage container;

evacuating inside a casing of the charged particle beam apparatus after arranging the sample storage container inside the casing;

adjusting a center of the diaphragm on an optical axis of the charged particle beam with a stage on which the sample storage container is set; and irradiating on the sample the charged particle beams that pass through or transmit the diaphragm, wherein the sample storage container is configured to be introduced from an outside of the casing of the charged particle beam apparatus into the casing, the casing and the storage container are separate from each other, and the charged particle beam apparatus capturing the image of the sample with the signal obtained by irradiating the charged particle beams on the sample in a state where an atmosphere of a space in which the sample is disposed is separated from an atmosphere inside the casing.

14. The image acquiring method according to claim 13 further comprising a step of:

checking whether the diaphragm is broken before the sample storage container is arranged in the casing of the charged particular beam apparatus.

* * * * *